United States Patent
Niu et al.

(10) Patent No.: US 11,055,627 B2
(45) Date of Patent: Jul. 6, 2021

(54) UNIVERSAL CONTROL FOR IMPLEMENTING QUANTUM GATES

(71) Applicant: Google LLC, Mountain View, CA (US)

(72) Inventors: Yuezhen Niu, El Segundo, CA (US); Hartmut Neven, Malibu, CA (US); Vadim Smelyanskiy, Mountain View, CA (US); Sergio Boixo Castrillo, Rancho Palos Verdes, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/961,388

(22) PCT Filed: Jan. 31, 2018

(86) PCT No.: PCT/US2018/016225
§ 371 (c)(1),
(2) Date: Jul. 10, 2020

(87) PCT Pub. No.: WO2019/152019
PCT Pub. Date: Aug. 8, 2019

(65) Prior Publication Data
US 2020/0364602 A1    Nov. 19, 2020

(51) Int. Cl.
*G06N 10/00* (2019.01)
*H03K 3/38* (2006.01)

(52) U.S. Cl.
CPC ............. *G06N 10/00* (2019.01); *H03K 3/38* (2013.01)

(58) Field of Classification Search
CPC .................................................. G06N 10/00
USPC ......................................................... 327/291
See application file for complete search history.

(56) References Cited

U.S. PATENT DOCUMENTS

| 7,655,850 B1* | 2/2010 | Ahn ................ B82Y 10/00 257/432 |
| 10,599,989 B2* | 3/2020 | Bravyi ............... G06F 30/392 |
| 2020/0410343 A1* | 12/2020 | Niu .................... G06N 10/00 |

FOREIGN PATENT DOCUMENTS

| EP | 3264339 | 1/2018 |
| WO | WO 2017/078735 | 5/2017 |

OTHER PUBLICATIONS

PCT International Preliminary Report on Patentability in International Appln No. PCT/US2018/016225, dated Aug. 13, 2020, 9 pages.

(Continued)

*Primary Examiner* — Hai L Nguyen
(74) *Attorney, Agent, or Firm* — Fish & Richardson P.C.

(57) ABSTRACT

Methods, systems, and apparatus for implementing a unitary quantum gate on one or more qubits. In one aspect, a method includes the actions designing a control pulse for the unitary quantum gate, comprising: defining a universal quantum control cost function, wherein the control cost function comprises a qubit leakage penalty term representing i) coherent qubit leakage, and ii) incoherent qubit leakage across all frequency components during a time dependent Hamiltonian evolution that realizes the unitary quantum gate; adjusting parameters of the time dependent Hamiltonian evolution to vary a control cost according to the control cost function such that leakage errors are reduced; generating the control pulse using the adjusted parameters; and applying the control pulse to the one or more qubits to implement the unitary quantum gate.

21 Claims, 4 Drawing Sheets

(56) References Cited

OTHER PUBLICATIONS

PCT International Search Report and Written Opinion in International Appln No. PCT/US2018/016225, dated Oct. 22, 2018, 16 pages.
Rebentrost et al., "Optimal Control of a Leaking Qubit", Chemistry and Chemical Biology, Harvard University, dated Aug. 2008, 4 pages.
Wood et al., "Qualification and Characterization of Leakage Errors", IBM T.J. Watson Research Center, dated Apr. 2017, 19 pages.

\* cited by examiner

UNIVERSAL CONTROL FOR IMPLEMENTING QUANTUM GATES

This application is a National Stage Application under 35 U.S.C. § 371 and claims the benefit of International Application No. PCT/US2018/016225, filed Jan. 31, 2018. The disclosure of the foregoing application is hereby incorporated by reference in its entirety.

BACKGROUND

This specification relates to quantum computing.

Large-scale quantum computers have the potential to provide fast solutions to certain classes of difficult problems. In gate model quantum computers, computational tasks are performed by implementing sequences of universal quantum gates, each of which specifies a trajectory of quantum computer's evolution. The faster quantum gate executes, the more computational capacity a given quantum device possesses.

SUMMARY

This specification describes methods and systems for universal control when implementing arbitrary quantum logic gates.

In general, one innovative aspect of the subject matter described in this specification can be implemented in a method for implementing a unitary quantum gate on one or more qubits, the method including the actions of: designing a control pulse for the unitary quantum gate, comprising: defining a universal quantum control cost function, wherein the control cost function comprises a qubit leakage penalty term representing i) coherent qubit leakage, and ii) incoherent qubit leakage across all frequency components during a time dependent Hamiltonian evolution that realizes the unitary quantum gate; adjusting parameters of the time dependent Hamiltonian evolution to vary a control cost according to the control cost function such that leakage errors are reduced; generating the control pulse using the adjusted parameters; and applying the control pulse to the one or more qubits to implement the unitary quantum gate.

Other implementations of this aspect include corresponding classical or quantum computer systems, apparatus, and computer programs recorded on one or more computer storage devices, each configured to perform the actions of the methods. A system of one or more computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations the universal control cost function further comprises a control constraint penalty term.

In some implementations the universal control cost function further comprises a total runtime penalty term.

In some implementations adjusting parameters of the time dependent Hamiltonian evolution comprises adjusting parameters of the time dependent Hamiltonian evolution to vary the control cost according to the control cost function such that total quantum gate runtime is reduced.

In some implementations the universal control cost function further comprises a gate fidelity penalty term.

In some implementations adjusting parameters of the time dependent Hamiltonian evolution comprises adjusting parameters of the time dependent Hamiltonian evolution to vary the control cost according to the control cost function such that quantum gate fidelity is increased.

In some implementations defining the universal quantum control cost function comprises: generating a block-off-diagonal component of an effective Hamiltonian with direct coupling leakage errors suppressed to second any given order; determining a coherent qubit leakage penalty sub-term using the generated block off-diagonal component of the effective Hamiltonian; determining an incoherent qubit leakage penalty sub-term using the generated block off-diagonal component of the effective Hamiltonian; and defining the qubit leakage penalty term as the sum of the coherent qubit leakage penalty sub-term and the incoherent qubit leakage penalty sub-term of both on-resonant and off-resonant frequency components.

In some implementations generating the block-off-diagonal component of an effective Hamiltonian comprises generalizing the time-dependent Schrieffer-Wolff transformation to suppress direct coupling qubit leakage to second any given order, comprising: separating a Hamiltonian characterizing the one or more qubits into multiple components, the components comprising a first component representing time-dependent coupling between different qubit energy subspaces, wherein the Hamiltonian is expressed in terms of multiple basis states; defining an effective Hamiltonian by performing a Schrieffer-Wolff transformation to rotate the Hamiltonian basis states, the effective Hamiltonian comprising an anti-Hermitian rotation operator; and determining a second given order solution of the rotation operator to generate a block-off-diagonal component of the effective Hamiltonian with direct coupling leakage errors suppressed to second the given order optionally wherein the given order is second order.

In some implementations the multiple components further comprise a second component representing a time-independent part of the Hamiltonian and a third component representing time-dependent coupling within each qubit energy subspace.

In some implementations each qubit energy subspace is separated from others by a sufficiently large energy gap.

In some implementations the determined second given order solution of the rotation operator comprises a perturbative solution.

In some implementations determining a coherent qubit leakage penalty sub-term using the generated block off-diagonal component of the effective Hamiltonian comprises: determining a sum of the amplitudes of all qubit states outside the computational energy subspace due to the block-off-diagonal component of the effective Hamiltonian.

In some implementations the coherent qubit leakage penalty sub-term is bounded above by a Frobenius norm of the block off-diagonal component of the effective Hamiltonian under an off-resonant assumption.

In some implementations determining an incoherent qubit leakage penalty sub-term using the generated block off-diagonal component of the effective Hamiltonian comprises: generalizing the applicability of the adiabatic theorem from pure states to energy subspaces, enabling time-dependent Hamiltonian evolution to occur within and between different energy subspaces; and determining the incoherent qubit leakage penalty sub-term using the and the generalized adiabatic theorem.

In some implementations the coherent qubit leakage penalty sub-term dominates in an off-resonant frequency regime and the incoherent qubit leakage penalty sub-term dominates in an on-resonant frequency regime.

In some implementations incoherent leakage comprises leakage resulting from violation of adiabaticity during a time dependent Hamiltonian evolution.

In some implementations coherent leakage comprises leakage resulting from direct coupling between a qubit's computational energy states and higher energy states.

In some implementations both coherent leakage and incoherent leakage comprise on-resonant frequency and off-resonant frequency leakage.

In some implementations adjusting parameters of the time dependent Hamiltonian evolution to vary a control cost according to the control cost function such that leakage errors are reduced comprises applying optimization techniques.

In some implementations the one or more qubits comprise superconducting qubits.

The subject matter described in this specification can be implemented in particular ways so as to realize one or more of the following advantages.

A system implementing quantum gates with universal control, as described in this specification, may improve the functionality and computational efficiency of a quantum computing device or hybrid classical-quantum computing device. For example, a quantum computing device performing the techniques described herein may implement quantum gates with reduced errors and required runtime, as well as increased quantum gate fidelity. As another example, an optimal balance between quantum gate runtime and fidelity may be determined. In addition, by implementing high fidelity quantum gates in a shortened gate runtime, near-term quantum computing devices may be used to solve hard problems outside of a classical computer's reach. Furthermore, the universality of the techniques described in this specification provides improved controllability of a quantum device.

A system implementing quantum gates with universal control, as described in this specification, may require less computational resources and time to implement high fidelity quantum gates. For example, designing a universal cost function that penalizes the form in which control pulses are used to realize quantum gates can greatly simplify an associated quantum control optimization procedure since minimizing a scalar function requires less computational resources and is a faster process than directly optimizing a high dimensional unitary evolution governed by the Schrödinger equation of a time-dependent quantum system and its environment.

A system implementing quantum gates with universal control, as described in this specification, may suppress all kinds of leakage errors across different frequency regimes during a generic time-dependent Hamiltonian evolution and is not restricted to suppressing leakage errors from a single source. Furthermore, all kinds of leakage errors are suppressed without requiring hard constraints on allowable forms of Hamiltonian modulation that impair the universality of the quantum control.

A system implementing quantum gates with universal control, as described in this specification, may implement arbitrary unitary single and multi-qubit gates.

For convenience, the techniques described in this specification are described as implementing a single quantum gate on one or more qubits. However, the applicability of the described system and techniques is fully scalable and may be extended to the implementation of sequences of quantum gates, where respective controls used to implement the sequence of gates can be merged into a single control, providing a speed up in computation time whilst increasing gate sequence fidelity.

The techniques described in this specification include a generalization of the adiabatic theorem from pure states to energy subspaces, allowing for time dependent Hamiltonian evolution to occur both within and between different subspaces. The generalized adiabatic theorem may have various applications that require the calculation of the population transfer between different subspaces where such generalized adabaticity applies, including leakage estimation, tunneling rate calculation and adiabatic quantum algorithm designs.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Due to prevalent noise and dissipation, existing quantum computers can operate for only a short amount of time before uncorrectable errors set in, destroying the embedded quantum information. In gate-model quantum computation, computational tasks are carried out by a sequence of universal quantum gates, each of which specifies a trajectory of the quantum computer's evolution. Generally, the faster a quantum gate or sequence of quantum gates executes, the more computational capacity the quantum computer possesses.

A major obstacle preventing shorter quantum gate execution time is leakage errors. Leakage errors may be defined as leakage of quantum information encoded in the state of a qubit from a predefined computational subspace into a higher dimensional subspace.

There are two distinct sources of leakage errors: coherent leakage error and incoherent leakage error. Coherent leakage error results from the direct coupling between a qubit's computational subspace and higher dimensional subspace. Incoherent leakage error results from modulation of the system Hamiltonian in a time-interval shorter than allowed by the condition for adiabaticity. For example, superconducting qubit architectures typically implement quantum gates via continuous modulation of a corresponding system Hamiltonian. An intuitive approach to realize a faster quantum gate is to increase the modulation of the quantum system. However, increased modulation results in more energy being pumped into the quantum computer which will more likely excite the quantum state of the quantum system to higher energy states that are outside of the predefined computational subspace, resulting in the introduction of incoherent leakage errors. Both sources of leakage error can be further categorized into on-resonant and off-resonant frequency contributions depending on whether its frequency component equals the energy gap between a qubit state and a higher excited state (on-resonant) or not (off-resonant).

Conventional techniques for characterizing and eliminating leakage errors consider the two different sources of leakage errors separately. For example, known techniques for characterizing and eliminating coherent and incoherent leakage errors include placing hard constraints on allowable forms of the Hamiltonian modulation. To avoid on-resonant incoherent leakage, a specific functional basis may be chosen for the control pulse that implements a quantum gate to zero out the unwanted frequency components. To avoid direct coupling leakage, microwave controls that couple a computational subspace with neighboring higher energy levels may be turned off when implementing a two-qubit entangling gate. These techniques, however, impair the universality of the quantum control: a single controlled time-dependent Hamiltonian evolution can no longer simulate arbitrary unitary gates. Another known technique for suppressing coherent or incoherent leakage errors is based on a perturbative diagonalization of the system Hamiltonian through application of the Schrieffer-Wolff transformation (SWT) or time-dependent SWT (TSWT).

Leakage errors are difficult to eliminate not only because of the fundamental trade-off between quantum gate fidelity and quantum operation run time, but also due to the current lack of a unified measure that accounts for total leakage error resulting from both sources. Without such a universal measure of total leakage error, it is challenging to directly design an optimal quantum control scheme for high fidelity fast quantum gates.

This specification describes methods and systems for reducing quantum gate time and leakage errors from both sources across different frequency regimes whilst increasing quantum gate fidelity. In particular, a universal control cost function that puts soft constraints on total leakage errors, quantum gate time and quantum gate infidelity in form of penalty terms, whilst guaranteeing the universality of quantum controls for simulating any unitary gate is described.

The universal control cost function bounds total leakage error. A total leakage bound, referred to herein as time dependent Schrieffer-Wolff transformation based leakage bound (TSWTLB), is formulated through the development of a generalized time-dependent Schrieffer-Wolff transformation (TSWT). The TSWTLB takes advantage of beneficial virtual transitions between the computational subspace and the unwanted higher energy subspaces while providing an upper bound on both direct coupling (coherent) and non-adiabatic (incoherent) leakage errors caused by both the on-resonant and off-resonant couplings throughout time-dependent Hamiltonian evolution.

To derive this leakage bound, a general time-dependent Schrieffer-Wolff transformation (TSWT) is formulated and its solution given up to any given order, e.g., second order. The generalized TSWT provides a rotated basis supported in a higher dimensional subspace where direct coupling leakage errors are suppressed to the given order. This rotated basis coincides with the qubit basis at the beginning and the end of quantum control procedure to enable convenient state initialization and readout. A first leakage bound corresponding to direct coupling leakage is formulated using the generalized TSWT.

A second leakage bound is formulated through a generalization of the adiabatic theorem from pure states to energy subspaces. This allows for time-dependent Hamiltonian evolution to occur both within and between different subspaces. The generalized adiabatic theorem provides an upper bound on the non-adiabatic (incoherent) leakage errors in the TSWT basis during a generic time-dependent Hamiltonian evolution.

Since the direct coupling leakage error is dominated by the off-resonant frequency component, while the non-adiabatic leakage errors are dominated by the on-resonant frequency components, the first and second leakage bounds may be combined in the universal cost function to provide an upper bound for all sources of leakage errors induced by both off-resonant and on-resonant leakage contributions.

The universal cost function provides increased controllability of the quantum system and enables the simulation of any unitary transformation with a single continuous control over the Hamiltonian evolution. Consequently, many controls corresponding to a sequence of quantum gates may be merged into a single control to speed up quantum computation while improving the overall fidelity.

Example Operating Environment

Figure 1:
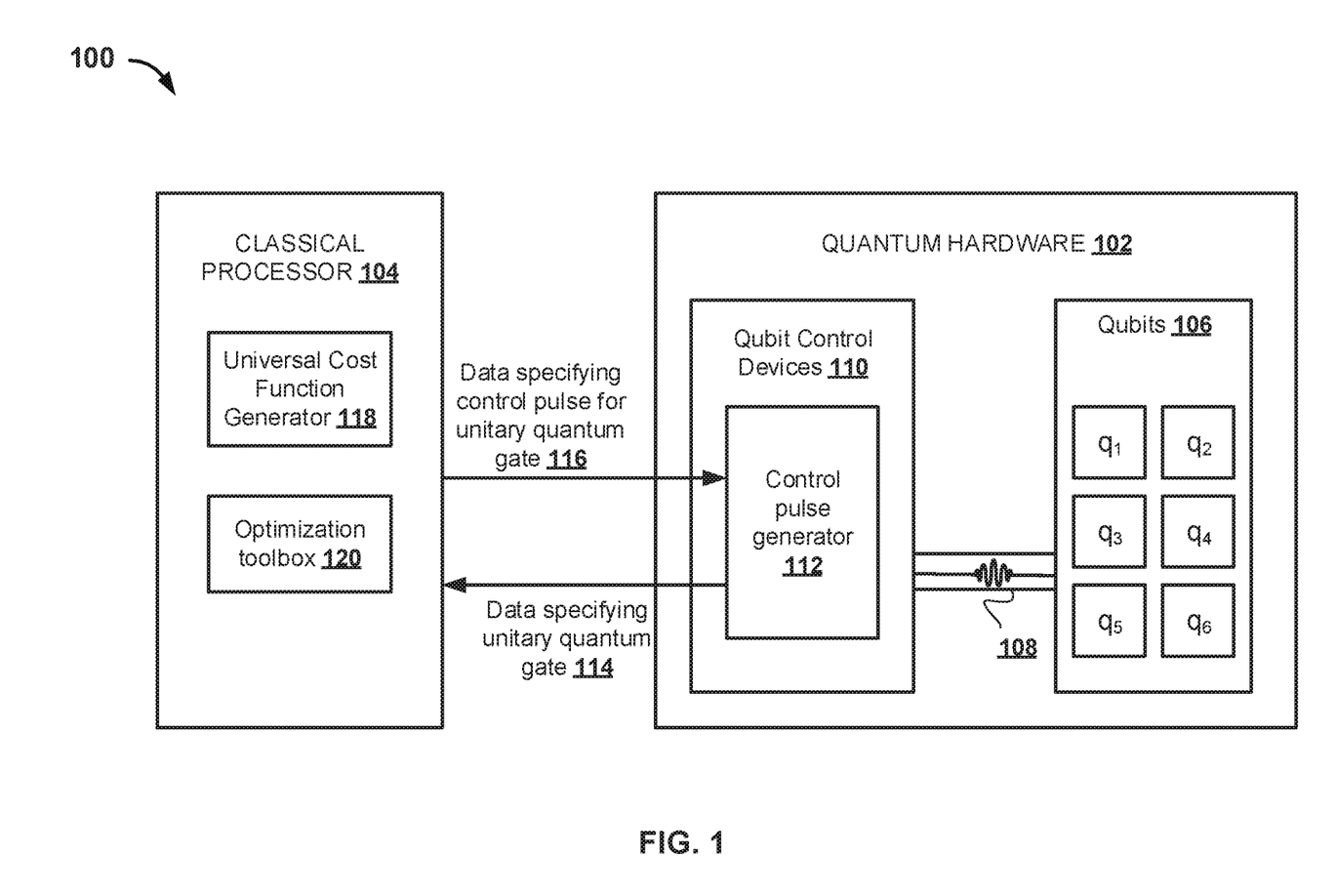
FIG. 1 depicts an example device for implementing high fidelity quantum gates.

FIG. 1 depicts an example system 100 for implementing arbitrary quantum gates with universal control. The example system 100 is an example of a system implemented as classical or quantum computer programs on one or more classical computers or quantum computing devices in one or more locations, in which the systems, components, and techniques described below can be implemented.

The system 100 includes quantum hardware 102 in data communication with a classical processor 104. The system 100 is configured to perform classical computations in combination with quantum computations using the classical processors 104 and the quantum hardware 102.

The quantum hardware 102 includes one or more qubits 106. The qubits 106 may include qubits that can be efficiently prepared in an initial state and operated on via application of quantum gates. The type of physical realizations of qubits included in the quantum hardware 102 may vary. For example, in some implementations the quantum hardware 102 may include superconducting qubits, e.g., superconducting charge qubits, superconducting flux qubits or superconducting phase qubits. In other implementations the quantum hardware 102 may include qubits realized by spins, e.g., electron spins, nuclear spins or atomic spins. Generally, the qubits 106 may be frequency tunable.

The qubits 106 may be engineered such that each qubit energy subspace is separated from others by a sufficiently large energy gap, as described in more detail below with reference to FIG. 4.

The quantum hardware 102 may include a set of qubit frequency control lines, e.g., where each cubit frequency control line corresponds to an individual qubit. The qubit frequency control lines control the frequency of the qubits 106, e.g., where each qubit frequency control line controls the frequency of its corresponding qubit.

The quantum hardware 102 may include one or more excitation drivelines. For convenience one driveline, e.g., driveline 108, is shown in FIG. 1, however in some implementations the quantum hardware may include multiple drivelines, e.g., one driveline corresponding to each of the qubits 106. The one or more excitation drivelines provide excitation control of the qubits 106. The one or more excitation drivelines may be configured to run excitation pulses (also referred to herein as control pulses), e.g., control pulse 108, with different quantum gates at different frequencies. Each qubit may be tuned towards or away from these frequencies on the one or more excitation drivelines.

The quantum hardware 102 may include a set of couplers. Each coupler in the set of couplers couples a corresponding qubit to an excitation driveline. The couplers may be any type of coupler, e.g., capacitive couplers. In order to achieve a capacitive coupling, a microwave line may be run adjacent to a qubit capacitor.

The quantum hardware 102 includes qubit control devices 110. The control devices 110 include devices configured to operate on the one or more qubits 106. For example, the control devices 110 may include hardware for implementing quantum logic gates, e.g., control pulse generator 112 that generates excitation pulses to be run on the one or more excitation drivelines. In some implementations the control pulse generator 112 may be a microwave control device. In addition, the control devices 112 may include hardware for performing measurements on the one or more qubits 106, e.g., oscillators.

The classical processor 104 is configured to perform quantum control optimization procedures. In particular, the classical processor 104 is configured to design control pulses for implementing respective quantum gates. For example, the classical processor 104 may receive data specifying a particular unitary quantum gate or sequence of multiple unitary quantum gates, e.g., input data 114. The classical processor 104 may then design control pulses that may be generated by the qubit control devices 110, e.g., control pulse generator 112, and applied to one or more of the qubits 106.

The control pulses designed by the classical processor 104 may be used to implement arbitrary unitary quantum gates with reduced leakage errors. In some cases the control pulses designed by the classical processor 104 may also be used to implement arbitrary unitary quantum gates with reduced leakage errors and one or more of increased gate fidelity or reduced total gate time.

To design such a control pulse, the classical processor 104 includes a universal cost function generator 118 that defines a universal quantum control cost function for a corresponding quantum gate or sequence of quantum gates. The universal quantum control cost function contains penalty terms on the forms of the control pulse that will be used to implement a unitary quantum gate. The penalty terms include a qubit leakage penalty term representing both coherent qubit leakage and incoherent qubit leakage during a time dependent Hamiltonian evolution of the qubit or qubits that realizes the unitary quantum gate. The penalty terms may further include a control constraint penalty term, total gate runtime penalty term, or a gate infidelity term. The form of such universal quantum control cost functions are described in more detail below with reference to FIGS. 2-4.

The classical processor 104 adjusts parameters of time dependent Hamiltonian evolution to vary a control cost according to the defined universal quantum control cost function to reduce leakage errors, optionally whilst also reducing gate infidelity and total gate time. For example, the classical processor 104 may include one or more optimization toolboxes that provide functions for maximizing or minimizing objectives while satisfying constraints, e.g., solvers for linear programming, quadratic programming, nonlinear programming, constrained linear least squares, nonlinear least squares, or nonlinear equations.

The adjusted parameters resulting from such optimization processes specify the control pulse. The classical processor 104 sends data specifying designed control pulses, e.g., output data 116, to the quantum hardware 102. An example process for implementing a unitary quantum gate on one or more qubits is described in detail below with reference to FIGS. 2-4.

Programming the Hardware

Figure 2:
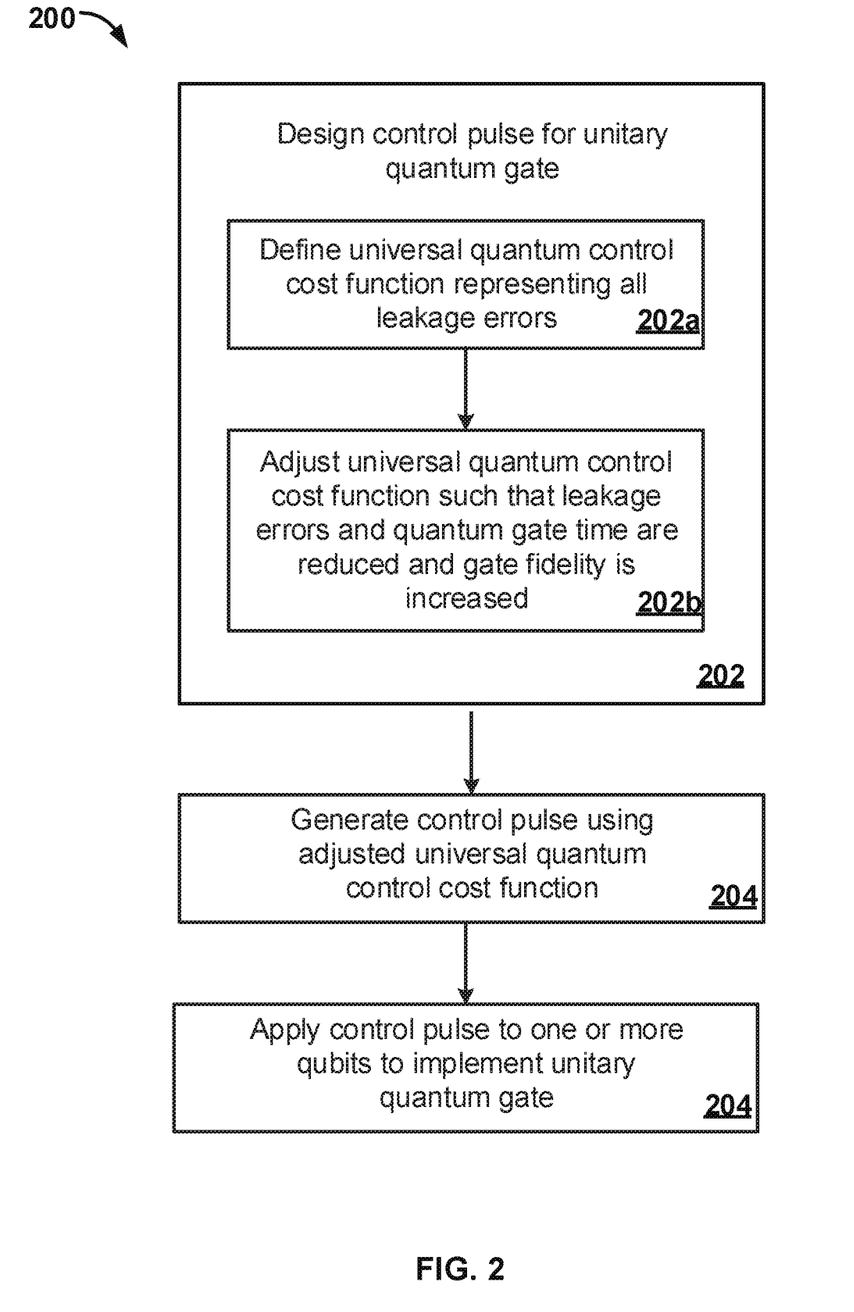
FIG. 2 is a flow diagram of an example process for implementing a unitary quantum gate on one or more qubits.

FIG. 2 is a flow diagram of an example process 200 for implementing a unitary quantum gate on one or more qubits. For convenience, the process 200 will be described as being performed by a system of one or more classical or quantum computing devices located in one or more locations. For example, the system 100 of FIG. 1 appropriately programmed in accordance with this specification can perform the process 200.

The system designs a control pulse for the unitary quantum gate (step 202). The unitary quantum gate may be a single qubit gate that operates on one qubit or a multi qubit gate that operates on multiple qubits. As described above with reference to FIG. 1, to implement the unitary quantum gate the control pulse may modulate a Hamiltonian characterizing the one or more qubits according to the unitary transformation U(T) given in Equation (1) below.

$$U(T) = \mathcal{T} [\exp(-i \int_0^T \hat{H}(t) dt)] \quad (1)$$

In Equation (1), $\mathcal{T}$ represents time-ordering, T represents total gate time, and $\hat{H}$ (t) represents the Hamiltonian characterizing the one or more qubits, also referred to herein as the system Hamiltonian. For example, in cases where the process 200 is used to implement an arbitrary single-qubit gate in a superconducting qubit, e.g., a gmon superconducting qubit, the Hamiltonian (after application of the rotating wave approximation) may be given by Equation (2) below $$\hat{H}_g(t) = \frac{\eta}{2}\hat{n}(\hat{n}-1) + \delta(t)\hat{n} + if(t)\left(\hat{a}e^{-i\phi(t)} - \hat{a}^\dagger e^{i\phi(t)}\right) \quad (2)$$

In Equation (2), η represents the anharmonicity of the Josephson junction, $\hat{n}$ represents the number operator, $\hat{a}$ represents the annihilation operator, δ(t) represents qubit detuning, $f$(t) represents amplitude and φ(t) represents the phase of the control pulse, where δ(t), $f$(t) and φ(t) can be continuously modulated. The subspace spanned by two lowest energy levels of each oscillator is chosen to be the qubit logical subspace $\mathcal{H}_2$=Span{|0⟩, |1⟩} where |n⟩ represents the Fock state with n excitations in the given mode.

When implementing the unitary quantum gate via modulation of the system Hamiltonian according to the unitary transformation U(T), leakage errors may be introduced. The term leakage errors describes leakage of quantum information into higher energy states outside the predefined computational subspace. As described above with reference to FIG. 1, there are two sources of leakage errors—coherent leakage errors resulting from direct coupling between a qubit's computational energy states and higher energy states and incoherent leakage errors resulting from violation of adiabaticity during a time dependent Hamiltonian evolution. Both types of leakage errors can further be categorized as on-resonant frequency and off-resonant frequency leakage.

Continuing the example above, a primary source of leakage errors when modulating the Hamiltonian $\hat{H}_g$(t) can be identified by decomposing the Hamiltonian $\hat{H}_g$(t) into three separate components $\hat{H}_g$(t)=$\hat{H}_0$(t)+$\hat{H}_1$(t)+$\hat{H}_2$(t) where the first term represents the time-independent part of the Hamiltonian:

$$\hat{H}_0(t) = \sum_{n=0}^{\infty} \frac{\eta}{2}\hat{n}(\hat{n}-1)|n\rangle\langle n|,$$

the second term represents time-dependent Hamiltonian coupling within the qubit computational subspace:

$$\hat{H}_1(t) = \sum_{n=0}^{\infty} \delta(t)n|n\rangle\langle n| + if(t)(|0\rangle\langle 1|e^{-i\phi(t)} - |1\rangle\langle 0|e^{i\phi(t)}),$$

and the third term represents control pulse, e. g., microwave control, coupling of the qubit computation.

$$\hat{H}_2(t) = if(t)\sum_{n=1}^{\infty}(|n\rangle\langle n+1|e^{-i\phi(t)} - |n+1\rangle\langle n|e^{i\phi(t)}),$$

The primary source of leakage errors originates from the non-zero microwave control in the third term. This term does not conserve the total excitation number and couples the computational state $|1\rangle$ with the higher energy state $|2\rangle$.

Due to the leakage errors described above, the result of the unitary transformation U(T) may differ to the intended action $U_{target}$ of the unitary quantum gate on the one or more qubits. The difference between the intended action $U_{target}$ of the unitary quantum gate on the one or more qubits and the simulated unitary transformation U(T) can be represented by the fidelity between $U_{target}$ and U(T), where a larger fidelity indicates that the unitary quantum gate realized via the unitary transformation is more truthful to an ideal realization of the unitary quantum gate. The fidelity is given by Equation (3) below.

$$F(U(T)) = \frac{1}{2^2}|Tr(U^\dagger(T)U_{target})|^2 \quad (3)$$

The system defines a universal quantum control cost function (step 202a). The universal quantum control cost function contains penalty terms on the forms of the control pulse. Such penalty terms provide the system with increased controllability of the one or more qubits and the implementation of the unitary quantum gate whilst simplifying the quantum control optimization procedure, since minimizing a scalar function is computationally less demanding than directly optimizing a high dimensional unitary evolution governed by the Schrödinger equation of a time-dependent quantum system and its environment.

To suppress the total leakage errors that cause quantum information to be lost to the environment, the universal quantum control cost function includes a qubit leakage penalty term $L_{TSWTLB}$ that represents both coherent qubit leakage and incoherent qubit leakage during the time dependent Hamiltonian evolution that realizes the unitary quantum gate. The specific form of the qubit leakage penalty term $L_{TSWTLB}$ is described in detail below with reference to FIG. 3.

To conveniently prepare and measure qubits in the computational basis at the beginning and the end of each Hamiltonian evolution, it is required that the term representing the time-dependent Hamiltonian coupling within the qubit computational subspace and the term representing control pulse coupling of the qubit computational subspace with the higher energy subspace, e.g., in the case of the gmon Hamiltonian the terms $\hat{H}_1(t)$ and $\hat{H}_2(t)$, vanish at both boundaries, such that the below described TSWT transformed basis and original qubit basis coincide. Such a control constraint may be enforced by adding a boundary control constraint penalty term to the total cost function. For example, in the case of the gmon Hamiltonian given above in Equation (2), the system may define the universal quantum control cost function as including the boundary control constraint penalty term $[\delta(t)^2|_{t=0,T} + f(t)^2|_{t=0,T}]$.

To reduce the total unitary quantum gate runtime T—a desirable property for near-term quantum devices—the universal quantum control cost function may further include a total runtime penalty term.

To reduce gate infidelity—the difference between the actual gate fidelity from its maximum value 1—the universal quantum control cost function may further include a gate fidelity penalty term 1−F(U(T)).

Continuing the example of the gmon Hamiltonian above, the total universal quantum cost function defined by the system may be given by Equation (4) below.

$$C(\alpha,\beta,\gamma,\kappa) = \alpha[1-F(U(T))] + \beta L_{TSMTLB} + \gamma[\delta(t)^2|_{t=0,T} + f(t)^2|_{t=0,T}] + \kappa T \quad (4)$$

In Equation (4), α penalizes the gate infidelity, β penalizes all sources of leakage error from the leakage bound $L_{TSMTLB}$ (described in more detail below with reference to FIG. 3), γ penalizes the violation of zero-value boundary constraint and κ penalizes long gate time.

The system adjusts the control over parameters of the time dependent Hamiltonian evolution, e.g., by tuning microwave pulse amplitude and phase or the flux biases across a Josephson junction, to vary a control cost according to the defined universal quantum control cost function such that leakage errors are reduced (step 202b). For example, the system may apply optimization techniques, e.g., those found in conventional optimization toolboxes such as stochastic gradient descent, differential evolution, dynamic programming, annealing algorithms, Monte Carlo methods and other machine learning techniques, to determine optimal parameters of the time dependent Hamiltonian evolution that define a control pulse that may implement the unitary quantum gate with minimal leakage errors.

In cases where the control cost function includes a total runtime penalty term, the system may adjust the parameters of the time dependent Hamiltonian evolution to vary a control cost according to the control cost function such that leakage errors are reduced and total gate time is reduced. For example, the system may apply optimization techniques to determine optimal parameters of the time dependent Hamiltonian evolution that define a control pulse that may implement the unitary quantum gate with reduced leakage errors and reduced total gate time.

In cases where the control cost function includes a gate infidelity penalty term, the system may adjust the parameters of the time dependent Hamiltonian evolution to vary a control cost according to the control cost function such that leakage errors are reduced and gate infidelity is reduced (gate fidelity is increased). For example, the system may apply optimization techniques to determine optimal parameters of the time dependent Hamiltonian evolution that define a control pulse that may implement the unitary quantum gate with reduced leakage errors and increased gate fidelity.

In some cases the system may apply optimization techniques to determine optimal parameters of the time dependent Hamiltonian evolution that define a control pulse that may implement the unitary quantum gate with reduced leakage errors, reduced gate infidelity, and reduced total gate time.

The system generates the control pulse using the adjusted parameters (step 204). Generating the control pulse may include converting the desired control pulse over Hamiltonians to electric/magnetic signals that control electronics that are applied to the quantum system.

The system applies the control pulse to the one or more qubits to implement the unitary quantum gate (step 206).

By replacing hard constraints on controls of system Hamiltonians with soft constraints on the total leakage errors, control boundary conditions, total gate time and gate infidelity in the form of corresponding penalty terms of a universal cost function for quantum control optimization, the controllability of the qubits is improved. In addition, the process 200 allows for any unitary transformation to be simulated with a single continuous control over the Hamiltonian evolution. Consequently, in some implementations the system may merge many controls for a sequence of quantum gates into a single control to speed up a quantum computation being performed by the system while improving the overall fidelity.

Penalizing Qubit Leakage

Figure 3:
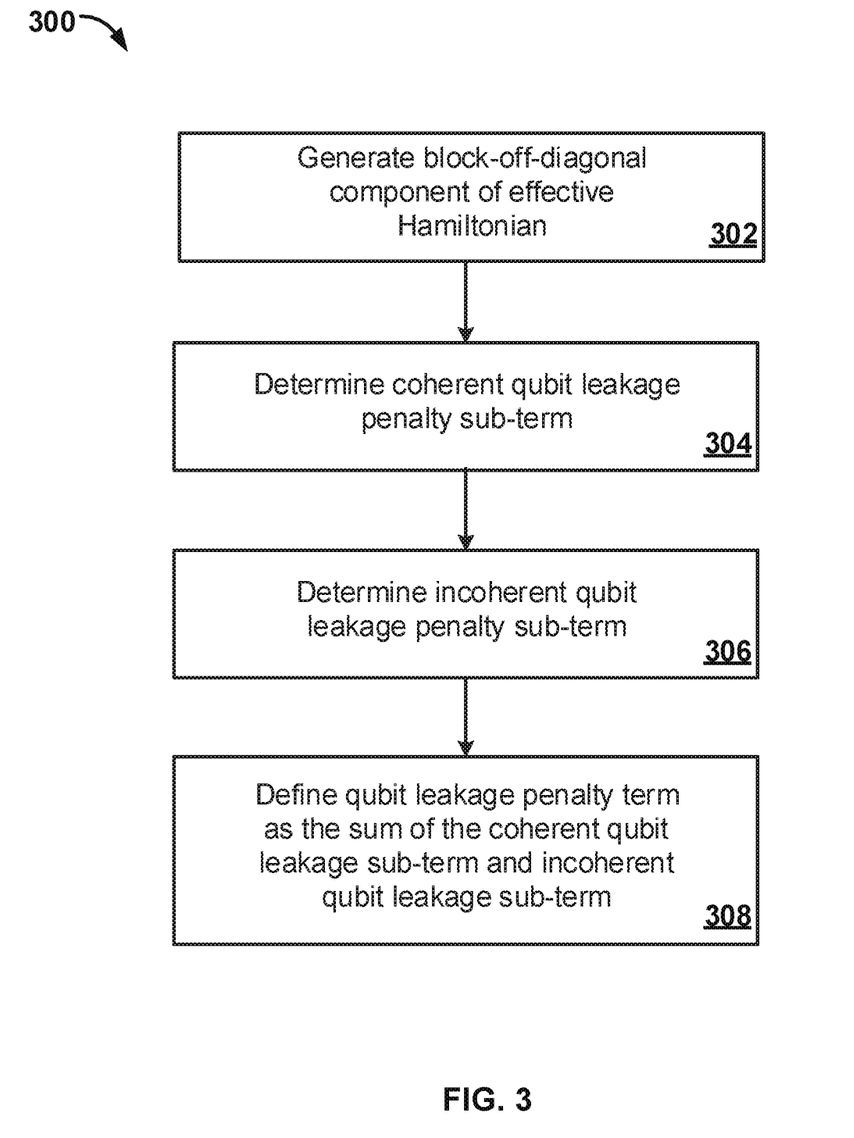
FIG. 3 is a flow diagram of an example process for defining a qubit leakage penalty term in a universal quantum control cost function.

FIG. 3 is a flow diagram of an example process 300 for defining a qubit leakage penalty term in a universal quantum control cost function. For convenience, the process 300 will be described as being performed by a system of one or more classical or quantum computing devices located in one or more locations. For example, the system 100 of FIG. 1 appropriately programmed in accordance with this specification can perform the process 300.

The system generates a block-off-diagonal component of an effective Hamiltonian with direct coupling leakage errors suppressed to any given order (step 302). Generating a block-off-diagonal component $\hat{\mathbb{H}}_{od}$ of an effective Hamiltonian with direct coupling leakage errors suppressed to the given order is described in more detail below with reference to FIG. 4.

The system determines a coherent qubit leakage penalty sub-term $L_{direct}$ using the generated block off-diagonal component of the effective Hamiltonian (step 304). Coherent qubit leakage is caused by the block-off-diagonal component of the effective Hamiltonian, since the block-off-diagonal component of the effective Hamiltonian directly couples the qubit computational energy subspace to the higher energy subspace. Therefore, to determine the coherent qubit leakage penalty sub-term $L_{direct}$, the system evaluates the population that transitions out of the qubit computational subspace due to the direct couplings $\|\hat{\mathbb{H}}'_{od}\|/\|\hat{\mathbb{H}}_{od}\| \ll \Delta$ with $\Delta$ representing the energy gap between the two lowest energy eigenstates by considering the interacting picture with quantum state basis $|\psi(t)\rangle_I = U_d^{-1}(t)|\psi(0)\rangle$ that relates to the Schrödinger picture basis initial state $|\psi(0)\rangle$ by a block diagonal Hamiltonian evolution $U_d(t)=\mathcal{T}[e^{-i\int_0^t \hat{\mathbb{H}}_d(\tau)d\tau}]$, where $\mathcal{T}$ represents the time-ordering. The Schrödinger equation in the interacting picture is given by Equation (5) below.

$$i\frac{d}{dt}|\psi(t)\rangle_I = U_d^{-1}(t)\hat{\mathbb{H}}_{od}(t)U_d(t)|\psi(0)\rangle_I, \quad (5)$$

$$|\psi(t)\rangle_I \approx \left[I - i\int_0^t U_d^{-1}(\tau)\hat{\mathbb{H}}_{od}(\tau)U_d(\tau)d\tau\right]|\psi(0)\rangle$$

In Equation (5), the initial condition $|\psi(0)\rangle_I = |\psi(0)\rangle_t$ is used and a first order Taylor expansion of the time ordered integration is performed since $\|\hat{\mathbb{H}}_{od}\|$ is of the order $O(\epsilon^3/\Delta^2)$. Since $U_d(t)$ preserves the computational subspace, the system determines the coherent qubit leakage penalty sub-term $L_{direct}$ by determining a sum of the amplitudes of all excited states outside the computational energy subspace due to the block-off-diagonal component of the effective Hamiltonian, as given below in Equation (6).

$$L_{direct}(t) = \sum_{a\neq 0, m \in \Omega_a} |\langle m(t)|(U_d(t)|\psi(0)\rangle - U_d(t)|\psi(t)\rangle_I)| \quad (6)$$

The system bounds the determined coherent qubit leakage penalty sub-term $L_{direct}$ by inserting Equation (5) into Equation (6), using the propagator relation $U_d(t)U_d^{-1}(\tau)=U_d(t,\tau)$, and approximating the diagonal unitary evolution with its dominant parts given by the time-independent energy gap. The system then bounds $L_{direct}$ using the Frobenius norm of the block off-diagonal component of the effective Hamiltonian under the off-resonant assumption. The bounded coherent qubit leakage penalty sub-term is given below in Equation (7).

$$L_{direct}(t) = \sum_{a\neq 0, m \in \Omega_a} |\langle m(t)|(U_d(t)|\psi(0)\rangle - U_d(t)|\psi(t)\rangle_I)| \stackrel{2}{=} \quad (7)$$

$$\sum_{a\neq 0, m \in \Omega_a} \left|\langle m(t)|\int_0^t U_d(t,\tau)\hat{\mathbb{H}}_{od}(\tau)U_d(\tau,t)d\tau|\psi(t)\rangle\right| \stackrel{3}{\approx}$$

$$\sum_{a\neq 0, m \in \Omega_a} \left|\langle m(t)|\int_0^t e^{-i\Delta_a(t-\tau)}\hat{\mathbb{H}}_{od}(\tau)d\tau|\psi(t)\rangle\right| \leq$$

$$\frac{\|\hat{\mathbb{H}}_{od}(0)\|}{\Delta(0)} + \frac{\|\hat{\mathbb{H}}_{od}(t)\|}{\Delta(t)}$$

Inserting the block-off-diagonal Hamiltonian after the given order TSWT described below with reference to FIG. 4 into Equation (8) provides a leakage bound that depends on both the first and second derivative of the system Hamiltonian.

The system determines an incoherent qubit leakage penalty sub-term $L_{non-adiabatic}$ using the generated block off-diagonal component of the effective Hamiltonian (step 306). Incoherent qubit leakage is caused by violation of adiabaticity during time-dependent Hamiltonian evolution, where $\|\hat{\mathbb{H}}'_{od}\|/\|\hat{\mathbb{H}}_{od}\| \sim \Delta$. To determine the incoherent qubit leakage penalty sub-term $L_{non-adiabatic}$, the system generalizes the applicability of the adiabatic theorem from pure states to energy subspaces, enabling time-dependent Hamiltonian evolution to occur within and between different energy subspaces. The system then determines the incoherent qubit leakage penalty sub-term using the generalized adiabatic theorem.

The generalized adiabatic theorem may be formulated as follows. Let $\hat{H}(s)$ be a twice differentiable Hamiltonian parameterized by a unit-free re-scaled time $s \in [0, 1]$ comprising three parts: $\hat{H}(s)=H_0+\hat{H}_d(s)+\hat{\mathbb{H}}_{od}(s)$, where $H_0=\sum_{\alpha=0}^{\infty}\sum_{m\in\Omega_\alpha} E_\alpha|m\rangle\langle m|$ ensures sufficiently large constant energy gap between the lowest energy subspace $\Omega_0$ and other higher energy subspaces, $\hat{\mathbb{H}}_d(s)$ is a time dependent term accounting for couplings within each non-degenerate subspace $\Omega_\alpha$ and $\hat{\mathbb{H}}_{od}(s)$ accounts for the coupling between different subspaces. The separation between the energy gap and inter/intra-subspace coupling is given by $$\Delta = \min_{\alpha}|E_\alpha - E_0| \gg |\hat{H}_d(s)| \sim |\hat{H}_{od}(s)| \sim \delta.$$

Let $|\phi_0(s)\rangle = \Sigma_{m \in \Omega_0} \alpha_m(s)|m\rangle$ be an instantaneous eigenstate in the lowest energy subspace $\Omega_0$ at physical time sT. Let $|\psi(s)\rangle$ be the state evolved from the same initial state $|\phi_0(0)\rangle$ at time s=0 under the total Hamiltonian $\hat{H}(s)$) to time s. The following inequality then bounds the difference between these two states at the final time T:

$$L_{non-adiabatic} \le \frac{1}{T}\left[\frac{1}{\Delta^2(s)}\left(\left\|\frac{d\hat{H}_{od}(s)}{ds}\right\| + T\|[\hat{H}_d(s), \hat{H}_{od}(s)]\|\right)_{s=1} + \right.$$
$$\frac{1}{\Delta^2(s)}\left(\left\|\frac{d\hat{H}_{od}(s)}{ds}\right\| + T\|[\hat{H}_d(s), \hat{H}_{od}(s)]\|\right)_{s=0} +$$
$$\int_0^1 \frac{5}{\Delta^3(s)}\left(\left\|\frac{d\hat{H}_{od}(s)}{ds}\right\| + T\|[\hat{H}_d(s), \hat{H}_{od}(s)]\|\right)^2 ds +$$
$$\int_0^1 \frac{1}{\Delta^2(s)}\left(T\|[\hat{H}_d(s), [\hat{H}_d(s), \hat{H}_{od}(s)]]\| + 2\left\|[\hat{H}_d(s), \frac{d\hat{H}_{od}(s)}{ds}]\right\| + \right.$$
$$\left.\left.2\left\|[\frac{d\hat{H}_d(s)}{ds}, \hat{H}_{od}(s)]\right\| + \frac{1}{T}\left\|\frac{d^2\hat{H}_{od}(s)}{ds^2}\right\|\right)ds\right]$$

The dominant contribution to the incoherent qubit leakage penalty sub-term $L_{non-adiabatic}$, is given by Equation (8) below $$L_{non-adiabatic} = \int_0^1 \frac{1}{\Delta^2(s)}\frac{1}{T}\left\|\frac{d^2\hat{H}_{od}(s)}{ds^2}\right\| ds \quad (8)$$

Since the coherent qubit leakage penalty sub-term $L_{direct}$ dominates in an off-resonant frequency regime $\|\hat{H}'_{od}\|/\|\hat{H}_{od}\| \ll \Delta$ and the incoherent qubit leakage penalty sub-term $L_{non-adiabatic}$ dominates in an on-resonant frequency regime $\|\hat{H}'_{od}\|/\|\hat{H}_{od}\| \sim \Delta$, the system defines the qubit leakage penalty term $L_{TSWTLB}$ as the sum of the coherent qubit leakage penalty sub-term $L_{direct}$ and the incoherent qubit leakage penalty sub-term $L_{non-adiabatic}$ (step 308). The qubit leakage penalty term $L_{TSWTLB}$ is given in Equation (9) below.

$$L_{TSWTLB} = \int_0^1 \frac{1}{\Delta^2(s)}\frac{1}{T}\left\|\frac{d^2\hat{H}_{od}(s)}{ds^2}\right\| ds + \frac{\|\hat{H}_{od}(0)\|}{\Delta(0)} + \frac{\|\hat{H}_{od}(T)\|}{\Delta(T)} \quad (9)$$

The leakage penalty term $L_{TSWTLB}$ enables hard constraints on the forms of system Hamiltonian to be relaxed to soft penalty terms in the universal quantum control cost function. Directly Optimizing the universal quantum control cost function allows for the reduction of leakage errors and total gate time whilst increasing gate fidelity without sacrificing the controllability of the quantum system.

Generalization of the Time-Dependent Schrieffer-Wolff Transformation

Figure 4:
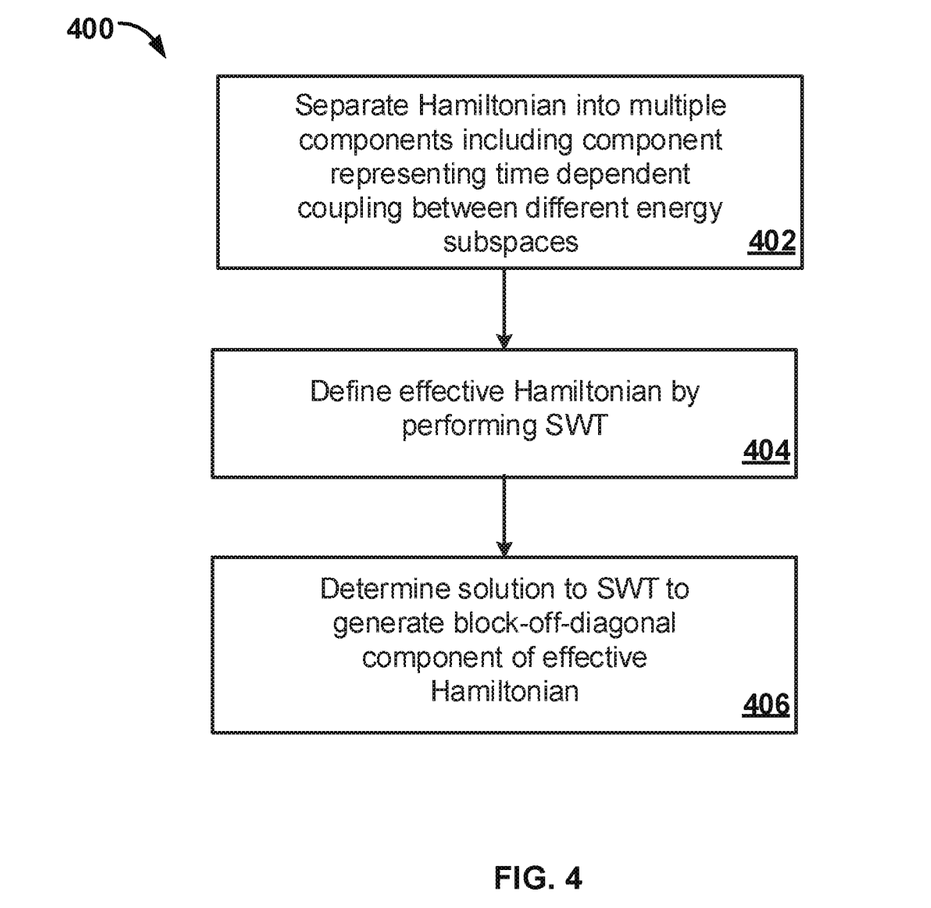
FIG. 4 is a flow diagram of an example process generalizing the time-dependent Schrieffer-Wolff transformation to suppress direct coupling qubit leakage to any given order.

FIG. 4 is a flow diagram of an example process 400 generalizing the time-dependent Schrieffer-Wolff transformation to suppress direct coupling qubit leakage to any given order. For convenience, the process 400 will be described as being performed by a system of one or more classical or quantum computing devices located in one or more locations. For example, the system 100 of FIG. 1 appropriately programmed in accordance with this specification can perform the process 400.

The system separates a Hamiltonian characterizing the one or more qubits into multiple components (step 402). The multiple components include a first component representing time-dependent coupling between different qubit energy subspaces, wherein the Hamiltonian is expressed in terms of multiple basis states. The multiple components may further include a second component representing a time-independent part of the Hamiltonian and a third component representing time-dependent coupling within each qubit energy subspace. For example, the Hamiltonian given above in Equation (2) may be separated into the below three components:

$$\hat{H}(t) = \hat{H}_0 + \hat{H}_1(t) + \hat{H}_2(t), \quad (10)$$
$$\hat{H}_0 = \sum_\alpha \sum_{m \in \Omega_\alpha} E_1|m\rangle\langle m|,$$
$$\hat{H}_1(t) = \sum_\alpha \sum_{m \in \Omega_\alpha} \langle m|\hat{H}_1^\alpha(t)|m'\rangle|m\rangle\langle m'|$$
$$\hat{H}_2(t) = \sum_{\alpha \ne \alpha'} \sum_{m \in \Omega_\alpha, m' \in \Omega_{\alpha'}} \langle m|\hat{H}_2^{\alpha,\alpha'}(t)|m'\rangle|\alpha, m\rangle\langle\alpha', m'|,$$

where $\hat{H}_0(t)$ represents the time-independent part of the Hamiltonian, $\hat{H}_1(t)$ represents the time-dependent coupling within each qubit energy subspace, referred to herein as the "block-diagonal term," and $\hat{H}_2(t)$ represents the time-dependent coupling between different qubit energy subspaces, referred to herein as the "block-off-diagonal term." In Equation (10), $\Omega_\alpha$ with $\alpha \in \{0, 1, 2, \ldots\}$ represents different energy subspaces and $|m\rangle$ represents an orthogonal basis state spanning each same energy subspace. It is assumed that the magnitudes of each of the multiple components obey:

$$\Delta = \min_{\alpha \ne 0}|E_\alpha - E_0| \gg |\langle m|\hat{H}_1^\alpha(t)|m'\rangle| \sim |$$
$$\langle m|\hat{H}_2^{\alpha,\alpha'}(t)|l\rangle| \in$$

for all m, m' $\in \Omega_\alpha$, $\alpha \ne \alpha'$ through our the time-dependent Hamiltonian evolution, where $\Delta$ and $\epsilon$ represent the different energy scales satisfying $\epsilon/\Delta \ll 1$. Under this assumption, each qubit energy subspace $\Omega_\alpha$ is separated from others by a sufficiently large energy gap that is substantially larger than the intra-subspace couplings.

The system defines an effective Hamiltonian $\hat{\mathbb{H}}$ by performing a Schrieffer-Wolff transformation to rotate the Hamiltonian basis state from $|\psi\rangle$ to $e^{-\hat{S}}|\psi\rangle$ (step 404). In this rotated basis, the effective Hamiltonian is given by the below Equation (11).

$$i\frac{d}{dt}|\tilde\psi\rangle = \hat{\mathbb{H}}|\tilde\psi\rangle = i\frac{de^{-\hat{S}}}{dt}e^{\hat{S}}|\tilde\psi\rangle + ie^{-\hat{S}}\frac{d}{dt}|\psi\rangle, \quad (11)$$
$$\hat{\mathbb{H}} = -i\sum_{j=0}^\infty \frac{1}{(j+1)!}[\hat{S}, S]_j + e^{-\hat{S}}\hat{H}e^{\hat{S}},$$

In Equation (11), the anti-Hermitian rotation operator $\hat{S}(t)$ contains non-zero terms between different energy subspaces and is therefore block-diagonal.

The system determines a given order solution of the rotation operator $\hat{S}(t)$ to generate a block-off-diagonal component $\mathbb{H}_{od}$ of the effective Hamiltonian $\mathbb{H}$ with direct coupling leakage errors suppressed to the given order (step 406). In particular, the system determines a perturbative solution of the rotation operator $\hat{S}(t) = \epsilon \hat{S}_1(t) + \epsilon_2 \hat{S}_2(t) + \ldots + \epsilon^n \hat{S}_n(t)$ that block diagonalizes the Hamiltonian $\hat{H}(t)$ such that the effective Hamiltonian's block-off-diagonal terms are suppressed to an order of O $(\epsilon^{n+1}/\Delta^n)$ for the n-th order perturbative solution of $\hat{S}(t)$. After the second order TSWT the block-off diagonal component $\mathbb{H}_{od}$ of the effective Hamiltonian with coupling suppressed to the order of O $(\epsilon^4/\Delta^3)$ is given by Equation (12) below.

$$(\mathbb{H}_{od})^{\alpha,\alpha'} = \frac{(\hat{H}_1^\alpha)^2 \hat{H}_2^{\alpha,\alpha'} - 2\hat{H}_1^\alpha \hat{H}_2^{\alpha,\alpha'} \hat{H}_1^{\alpha'} + \hat{H}_2^{\alpha,\alpha'}(\hat{H}_1^{\alpha'})^2}{(E_{\alpha'} - E_\alpha)^2} + \frac{2}{3(E_{\alpha'} - E_\alpha)} \sum_\gamma \left[ \frac{\hat{H}_2^{\alpha,\alpha'} \hat{H}_2^{\alpha',\gamma} \hat{H}_2^{\gamma,\alpha'}}{E_{\alpha'} - E_\gamma} - \frac{\hat{H}_2^{\alpha,\gamma} \hat{H}_2^{\gamma,\alpha} \hat{H}_2^{\alpha,\alpha'}}{E_\alpha - E_\gamma} \right] - i \left[ \frac{\dot{\hat{H}}_1^\alpha \hat{H}_2^{\alpha,\alpha'} + 2\hat{H}_1^\alpha \dot{\hat{H}}_2^{\alpha,\alpha'} - 2\dot{\hat{H}}_2^{\alpha,\alpha'} \hat{H}_1^{\alpha'} - \hat{H}_2^{\alpha,\alpha'} \dot{\hat{H}}_1^{\alpha'}}{(E_{\alpha'} - E_\alpha)^2} \right] - \frac{\ddot{\hat{H}}_2^{\alpha,\alpha'}}{(E_{\alpha'} - E_\alpha)^2} + O\left(\frac{\epsilon^4}{\Delta^3}\right). \quad (12)$$

Implementations of the digital and/or quantum subject matter and the digital functional operations and quantum operations described in this specification can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, Which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

The invention claimed is:

1. A method for implementing a unitary quantum gate on one or more qubits, the method comprising:
designing a control pulse for the unitary quantum gate, comprising:
defining a universal quantum control cost function, wherein the control cost function comprises a qubit leakage penalty term representing i) coherent qubit leakage, and ii) incoherent qubit leakage across all frequency components during a time dependent Hamiltonian evolution that realizes the unitary quantum gate;
adjusting parameters of the time dependent Hamiltonian evolution to vary a control cost according to the control cost function such that leakage errors are reduced;
generating the control pulse using the adjusted parameters; and
applying the control pulse to the one or more qubits to implement the unitary quantum gate.

2. The method of claim 1, wherein the universal control cost function further comprises a control constraint penalty term.

3. The method of claim 1, wherein the universal control cost function further comprises a total runtime penalty term.

4. The method of claim 3, wherein adjusting parameters of the time dependent Hamiltonian evolution comprises adjusting parameters of the time dependent Hamiltonian evolution to vary the control cost according to the control cost function such that total quantum gate runtime is reduced.

5. The method of claim 1, wherein the universal control cost function further comprises a gate fidelity penalty term.

6. The method of claim 5, wherein adjusting parameters of the time dependent Hamiltonian evolution comprises adjusting parameters of the time dependent Hamiltonian evolution to vary the control cost according to the control cost function such that quantum gate fidelity is increased.

7. The method of claim 1, wherein defining the universal quantum control cost function comprises:
generating a block-off-diagonal component of an effective Hamiltonian with direct coupling leakage errors suppressed to any given order;
determining a coherent qubit leakage penalty sub-term using the generated block off-diagonal component of the effective Hamiltonian;
determining an incoherent qubit leakage penalty sub-term using the generated block off-diagonal component of the effective Hamiltonian; and
defining the qubit leakage penalty term as the sum of the coherent qubit leakage penalty sub-term and the incoherent qubit leakage penalty sub-term of both on-resonant and off-resonant frequency components.

8. The method of claim 7, wherein generating the block-off-diagonal component of an effective Hamiltonian comprises generalizing the time-dependent Schrieffer-Wolff transformation to suppress direct coupling qubit leakage to any given order, comprising:
separating a Hamiltonian characterizing the one or more qubits into multiple components, the components comprising a first component representing time-dependent coupling between different qubit energy subspaces, wherein the Hamiltonian is expressed in terms of multiple basis states;
defining an effective Hamiltonian by performing a Schrieffer-Wolff transformation to rotate the Hamiltonian basis states, the effective Hamiltonian comprising an anti-Hermitian rotation operator; and
determining a given order solution of the rotation operator to generate a block-off-diagonal component of the effective Hamiltonian with direct coupling leakage errors suppressed to the given order, optionally wherein the given order is second order.

9. The method of claim 8, wherein the multiple components further comprise a second component representing a time-independent part of the Hamiltonian and a third component representing time-dependent coupling within each qubit energy subspace.

10. The method of claim 8, wherein each qubit energy subspace is separated from others by a sufficiently large energy gap.

11. The method of claim 8, wherein the determined given order solution of the rotation operator comprises a perturbative solution.

12. The method of claim 7, wherein determining a coherent qubit leakage penalty sub-term using the generated block off-diagonal component of the effective Hamiltonian comprises:
determining a sum of the amplitudes of all qubit states outside the computational energy subspace due to the block-off-diagonal component of the effective Hamiltonian.

13. The method of claim 12, wherein the coherent qubit leakage penalty sub-term is bounded above by a Frobenius norm of the block off-diagonal component of the effective Hamiltonian.

14. The method of claim 7, wherein determining an incoherent qubit leakage penalty sub-term using the generated block off-diagonal component of the effective Hamiltonian comprises:
generalizing the applicability of the adiabatic theorem from pure states to energy subspaces, enabling time-dependent Hamiltonian evolution to occur within and between different energy subspaces; and
determining the incoherent qubit leakage penalty sub-term using the generalized adiabatic theorem.

15. The method of claim 14, wherein both coherent leakage and incoherent leakage comprise on-resonant frequency and off-resonant frequency leakage.

16. The method of claim 7, wherein the coherent qubit leakage penalty sub-term dominates in an off-resonant frequency regime and the incoherent qubit leakage penalty sub-term dominates in an on-resonant frequency regime.

17. The method of claim 1, wherein coherent leakage comprises leakage resulting from direct coupling between a qubit's computational energy states and higher energy states.

18. The method of claim 1, wherein incoherent leakage comprises leakage resulting from violation of adiabaticity during a time dependent Hamiltonian evolution.

19. The method of claim 1, wherein adjusting parameters of the time dependent Hamiltonian evolution to vary a control cost according to the control cost function such that leakage errors are reduced comprises applying optimization techniques.

20. The method of claim 1, wherein the one or more qubits comprise superconducting qubits.

21. An apparatus for implementing a single qubit unitary quantum gate, the apparatus comprising:
one or more classical processors;
a quantum device in data communication with the one or more classical processors, wherein the quantum device comprises:
one or more qubits;
one or more control pulse drivelines;
one or more couplers, each coupler coupling a corresponding qubit to a control pulse driveline;
a control pulse generator configured to generate control pulses on the one or more drivelines;
wherein the apparatus is configured to perform the method of claim 1.

* * * * *